(12) United States Patent
Yu

(10) Patent No.: US 6,657,874 B2
(45) Date of Patent: Dec. 2, 2003

(54) SEMICONDUCTOR CONVERTER CIRCUIT AND CIRCUIT MODULE

(75) Inventor: Yoshiharu Yu, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/109,875

(22) Filed: Apr. 1, 2002

(65) Prior Publication Data

US 2003/0099120 A1 May 29, 2003

(30) Foreign Application Priority Data

Nov. 27, 2001 (JP) ........................................ 2001-360636

(51) Int. Cl.⁷ ................................................ H02H 7/10
(52) U.S. Cl. ....................................................... 363/50
(58) Field of Search ........................ 363/50, 55, 56.01, 363/57; 323/222, 223, 229, 233

(56) References Cited

U.S. PATENT DOCUMENTS

| | | | | |
|---|---|---|---|---|
| 5,206,605 A | * | 4/1993 | Brannon et al. | 330/252 |
| 5,331,477 A | * | 7/1994 | Sugiyama | 360/59 |
| 5,661,644 A | | 8/1997 | Bergman et al. | |
| 5,670,974 A | * | 9/1997 | Ohba et al. | 345/60 |
| 5,771,164 A | * | 6/1998 | Murai et al. | 363/89 |
| 5,945,801 A | * | 8/1999 | Yamada et al. | 318/701 |

FOREIGN PATENT DOCUMENTS

| | | |
|---|---|---|
| JP | 61-26251 | 2/1986 |
| JP | 2-130953 | 5/1990 |
| JP | 2000-102245 | 4/2000 |

* cited by examiner

Primary Examiner—Matthew V. Nguyen
(74) Attorney, Agent, or Firm—Oblon, Spivak, McClelland, Maier & Neustadt, P.C.

(57) ABSTRACT

A diode (4) is a reverse blocking rectifier diode and connected in series to an IGBT (3) in a direction where a forward current flows in the diode (4) when the IGBT (3) comes into an ON state. Further, a diode (6) is a reverse blocking rectifier diode and connected in series to an IGBT (5) in a direction where a forward current flows in the diode (6) when the IGBT (5) comes into an ON state. A cathode of the diode (4) and a collector of the IGBT (5) are connected to each other through a node (7). A load (8) is connected to the node (7). The diodes (4, 6) are made of silicon carbide (SiC). With such a configuration achieved is a semiconductor converter circuit using a reverse blocking diode in which the forward voltage drop and the amount of reverse recovery electric charges are reduced as compared with a high-speed diode made of silicon.

10 Claims, 6 Drawing Sheets

F I G . 3
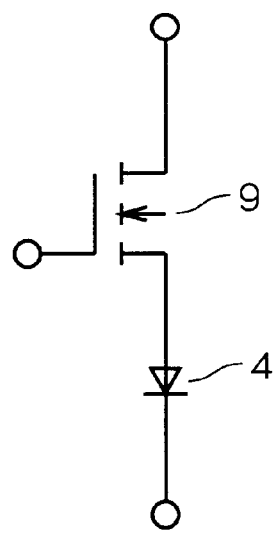
F I G . 4
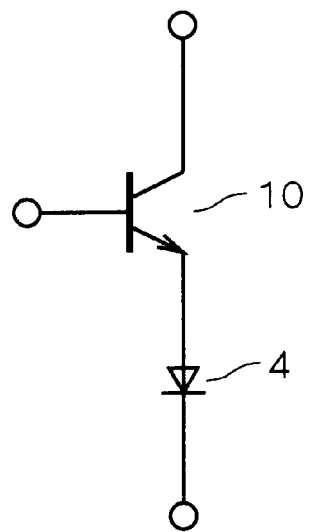

US 6,657,874 B2

SEMICONDUCTOR CONVERTER CIRCUIT AND CIRCUIT MODULE

BACKGROUND OF THE INVENTION

1. Field of the Invention

The present invention relates to a semiconductor converter circuit and a circuit module.

2. Description of the Background Art

Semiconductor power converter circuits such as current-type inverters use switching elements such as IGBTs (Insulated Gate Bipolar Transistors) and power MOSFETs. Further, when the converter circuits use elements substantially having no reverse breakdown voltage for use as power devices (i.e., elements of reverse conductivity type) as the switching elements, reverse blocking diodes are connected in series to the switching elements, for blocking application of reverse voltage to the switching elements. As the reverse blocking diodes, conventionally, used are rectifier diodes made of silicon which utilize a pn junction formed in a silicon substrate.

Further, high-speed diodes are sometimes used as the rectifier diodes, and in the high-speed diodes, heavy metals such as gold and platinum are diffused in the silicon substrate to reduce the lifetime of minority carriers and the reverse recovery time thereby becomes shorter.

The background-art high-speed diodes of silicon have problems that the forward voltage drop is large and the amount of reverse recovery electric charges (the time integral of reverse recovery time and reverse current) is still large. These problems lead to increased power loss and deterioration in efficiency of the semiconductor converter circuit.

SUMMARY OF THE INVENTION

An object of the present invention is to provide a semiconductor converter circuit and a circuit module both using a reverse blocking diode in which the forward voltage drop and the amount of reverse recovery electric charges are reduced as compared with the background-art high-speed diode made of silicon.

According to a first aspect of the present invention, the semiconductor converter circuit includes a switching element of reverse conductivity type and a diode made of silicon carbide. The diode is connected in series to the switching element at a polarity in which a forward current flows when the switching element comes into an ON state.

In the semiconductor converter circuit of the first aspect of the present invention, the diode made of silicon carbide is used as the reverse blocking diode connected in series to the switching element. Therefore, as compared with the semiconductor converter circuit using the diode made of silicon as the reverse blocking diode, the switching loss is remarkably reduced to improve efficiency and it is possible to prevent breakdown of the switching element by high reverse recovery voltage.

Preferably, in the semiconductor converter circuit of the first aspect, the diode is a Schottky diode.

In the semiconductor converter circuit of the first aspect of the present invention, by using the Schottky diode made of silicon carbide as the reverse blocking diode, it is possible to achieve characteristics of smaller forward voltage drop, a smaller amount of reverse recovery electric charges, higher breakdown voltage and the like and ensure further improvement of efficiency.

Preferably, in the semiconductor converter circuit of the first aspect of the present invention, the diode is connected to at least one of an anode side and a cathode side of the switching element.

In the semiconductor converter circuit of the first aspect of the present invention, by connecting the diode in particular to the anode side of the switching element, it is possible to achieve a so-called common emitter or common source circuit configuration. Therefore, by connecting the emitter or source of the switching element to a GND terminal of a control circuit, the semiconductor converter circuit and the control circuit can share the GND terminal and the circuit configuration can be thereby simplified.

Preferably, in the semiconductor converter circuit of the first aspect of the present invention, the switching element is one of an IGBT (Insulated Gate Bipolar Transistor), a power MOSFET, a bipolar power transistor, a thyristor, a GTO (Gate Turn-Off) thyristor and a GCT (Gate Commutated Turn-Off) thyristor.

In the semiconductor converter circuit of the first aspect of the present invention, it is possible to reduce the switching loss in one of the IGBT, the power MOSFET, the bipolar power transistor, the thyristor, the GTO thyristor and the GCT thyristor.

Preferably, the semiconductor converter circuit of the first aspect of the present invention is one of an inverter circuit, a converter circuit, a matrix converter circuit and an AC switching circuit.

In the semiconductor converter circuit of the first aspect of the present invention, it is possible to reduce the switching loss of the switching element used in one of the inverter circuit, the converter circuit, the matrix converter circuit and the AC switching circuit.

According to a second aspect of the present invention, the circuit module includes: a substrate on which the semiconductor converter circuit of the first aspect is formed; a package in which the substrate is provided; and a connection terminal formed on the package, for connecting the semiconductor converter circuit and an external device.

In the circuit module of the second aspect of the present invention, by modularizing the semiconductor converter circuit into the circuit module, it is possible to ensure downsizing of the device, reduction of wire inductance, simplification of control circuits and peripheral circuits and the like.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 3 to 6 are circuit diagrams showing variations of a switching element;

DESCRIPTION OF THE PREFERRED EMBODIMENTS

Figure 1:
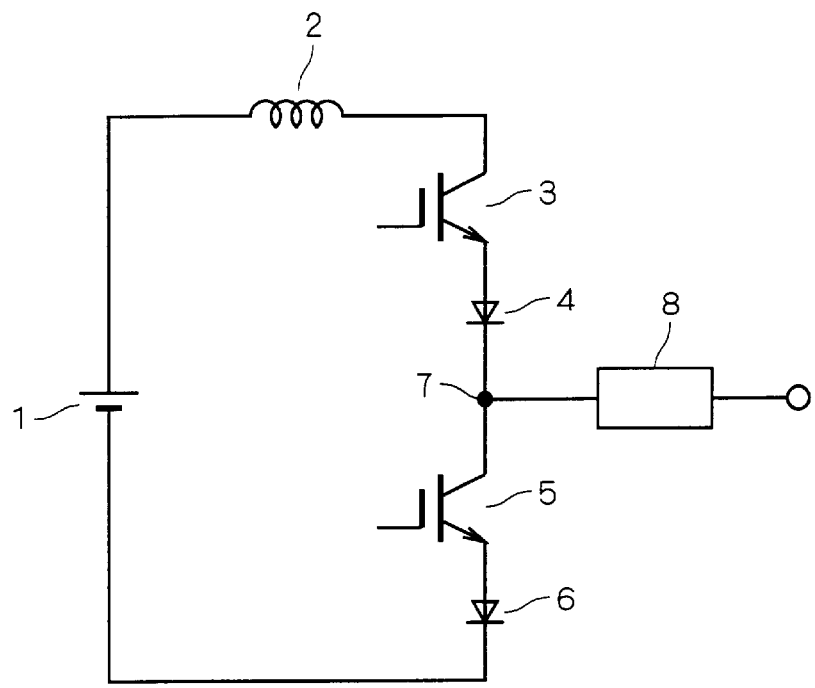
FIG. 1 is a circuit diagram showing a configuration of a single-phase current-type inverter circuit as a first practical example of a semiconductor converter circuit in accordance with a preferred embodiment of the present invention.

FIG. 1 is a circuit diagram showing a configuration of a single-phase current-type inverter circuit as the first practical example of a semiconductor converter circuit in accordance with the preferred embodiment of the present invention. The inverter circuit shown in FIG. 1 comprises a DC voltage source 1, a coil 2, IGBTs 3 and 5 and diodes 4 and 6. The IGBTs 3 and 5 are switching elements of reverse conductivity type. The diode 4 is a reverse blocking rectifier diode and connected in series to the IGBT 3 at a polarity in which a forward current flows in the diode 4 when the IGBT 3 comes into an ON state. Specifically, an anode of the diode 4 and an emitter (cathode) of the IGBT 3 are connected to each other. The diode 6 is a reverse blocking rectifier diode and connected in series to the IGBT 5 at a polarity in which a forward current flows in the diode 6 when the IGBT 5 comes into an ON state. Specifically, an anode of the diode 6 and an emitter (cathode) of the IGBT 5 are connected to each other. A cathode of the diode 4 and the collector of the IGBT 5 are connected to each other through a node 7. Further, a load 8 is connected to the node 7.

The diodes 4 and 6 are made of silicon carbide (SiC). The silicon carbide has characteristics of wider band gap, higher resistance against high electric field, higher thermal stability, higher thermal conductivity and the like as compared with silicon. Therefore, using the diode made of silicon carbide as the reverse blocking diodes 4 and 6 makes it possible to greatly improve the characteristics of the semiconductor converter circuit.

Specifically, the diode made of silicon carbide has characteristics of higher breakdown voltage, lower forward recovery voltage, a smaller amount of reverse recovery electric charges, using a wafer thinner than a silicon wafer, smaller forward voltage drop and the like, as compared with the diode made of silicon. Therefore, using the diode made of silicon carbide as the reverse blocking diodes 4 and 6 ensures improvements of efficiency by reduction of switching loss and the like.

The diodes 4 and 6 may be Schottky diodes made of silicon carbide utilizing Schottky barrier, not the rectifier diodes utilizing the pn junction. Though the Schottky diode generally has characteristics of smaller forward voltage drop and a smaller amount of reverse recovery electric charges as compared with the rectifier diode, the Schottky diode made of silicon has low breakdown voltage of 100 to 200 V. In contrast to this, the Schottky diode made of silicon carbide has a breakdown voltage higher than that of the Schottky diode of silicon, and therefore using the Schottky diode made of silicon carbide as the reverse blocking diodes 4 and 6 can achieve characteristics of smaller forward voltage drop, a smaller amount of reverse recovery electric charges, higher breakdown voltage and the like and ensure further improvement of efficiency.

Figure 2:
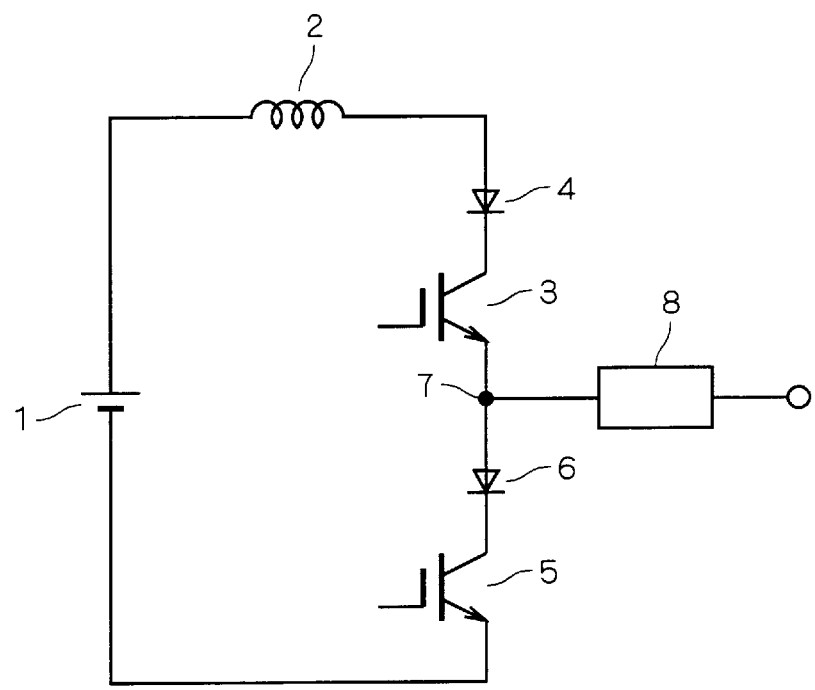
FIG. 2 is a circuit diagram showing another configuration of the single-phase current-type inverter circuit in accordance with the preferred embodiment of the present invention.
Figure 5:
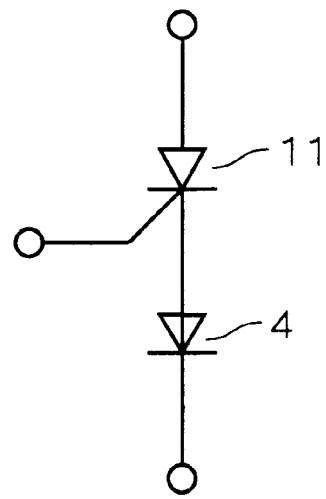
Figure 6:
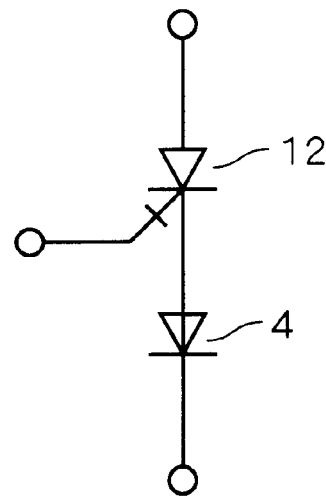

FIG. 2 is a circuit diagram showing another configuration of the single-phase current-type inverter circuit in accordance with the preferred embodiment of the present invention. Though the anodes of the diodes 4 and 6 are connected to the emitters of the IGBTs 3 and 5, respectively, in FIG. 1, the connection of the diodes 4 and 6 and the IGBTs 3 and 5 may be replaced so that cathodes of the diodes 4 and 6 can be connected to collectors (anodes) of the IGBTs 3 and 5, respectively. The same applies to the second to fifth practical examples discussed later. Thus, connection of the diodes 4 and 6 to the collector side of the IGBTs 3 and 5 can achieve a so-called common emitter circuit configuration. Therefore, by connecting the emitter of the IGBT 5 to a GND terminal of a control circuit (not shown) for controlling the inverter circuit, the inverter circuit and the control circuit can share the GND terminal and the circuit configuration can be thereby simplified. Further, the diodes 4 and 6 may be provided on both the anodes and cathodes of the IGBTs 3 and 5.

FIGS. 3 to 6 are circuit diagrams showing variations of the switching element. Though the IGBTs 3 and 5 are used as the switching elements in FIGS. 1 and 2, instead of the IGBTs 3 and 5, one of a power MOSFET 9 shown in FIG. 3, a bipolar power transistor 10 shown in FIG. 4, a thyristor (Silicon Controlled Rectifier: SCR) 11 shown in FIG. 5, a GTO (Gate Turn-Off) thyristor 12 shown in FIG. 6 and a GCT (Gate Commutated Turn-Off) thyristor which is a developed type of the GTO thyristor (the circuit diagram is the same as FIG. 6) may be used.

For example, when the power MOSFET 9 is used instead of the IGBT 3 in FIG. 1, a source (cathode) of the power MOSFET 9 and the anode of the diode 4 are connected to each other. Further, when the power MOSFET 9 is used instead of the IGBT 3 in FIG. 2, a drain (anode) of the power MOSFET 9 and the cathode of the diode 4 are connected to each other.

Furthermore, for the reason of device structure, a reverse blocking-type switching element cannot be formed of the power MOSFET or the bipolar power transistor. For this reason, when the power MOSFET or the bipolar power transistor is used as the switching element of the semiconductor converter circuit, a reverse blocking diode is needed. Further, though a reverse blocking-type switching element can be formed of the IGBT, the IGBT of reverse blocking type has larger forward voltage drop and much worse reverse recovery characteristic than the IGBT of reverse conductivity type. Therefore, when the IGBT is used as the switching element of the semiconductor converter circuit, generally, a reverse blocking diode is connected in series to the IGBT of reverse conductivity type. Further, though a reverse blocking-type switching element can be formed of the thyristor, the GTO thyristor or the GCT thyristor, a reverse blocking diode is sometimes connected to the thyristor of reverse conductivity type or the like.

Figure 7:
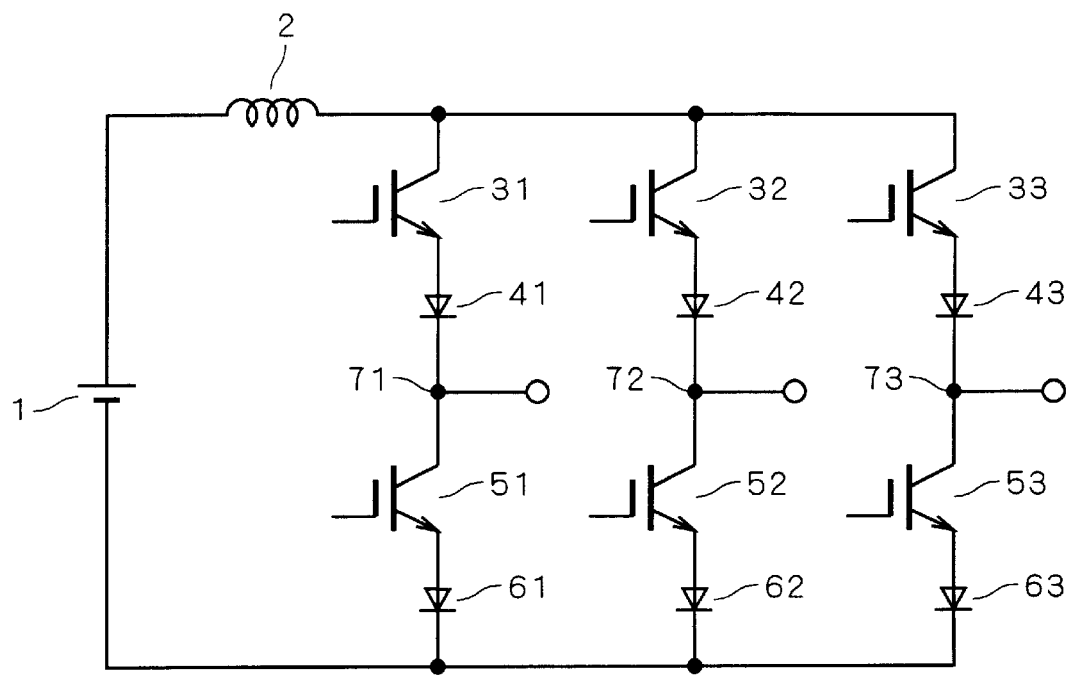
FIG. 7 is a circuit diagram showing a configuration of a three-phase current-type inverter circuit as a second practical example of the semiconductor converter circuit in accordance with the preferred embodiment of the present invention.

FIG. 7 is a circuit diagram showing a configuration of a three-phase current-type inverter circuit as the second practical example of the semiconductor converter circuit in accordance with the preferred embodiment of the present invention. The inverter circuit shown in FIG. 7 comprises IGBTs 31 to 33 and 51 to 53 and diodes 41 to 43 and 61 to 63. The diodes 41 to 43 and 61 to 63 are reverse blocking diodes (rectifier diodes or Schottky diodes) made of silicon carbide, and connected in series to the IGBTs 31 to 33 and 51 to 53, respectively. Loads (now shown) are connected to nodes 71 to 73.

Figure 8:
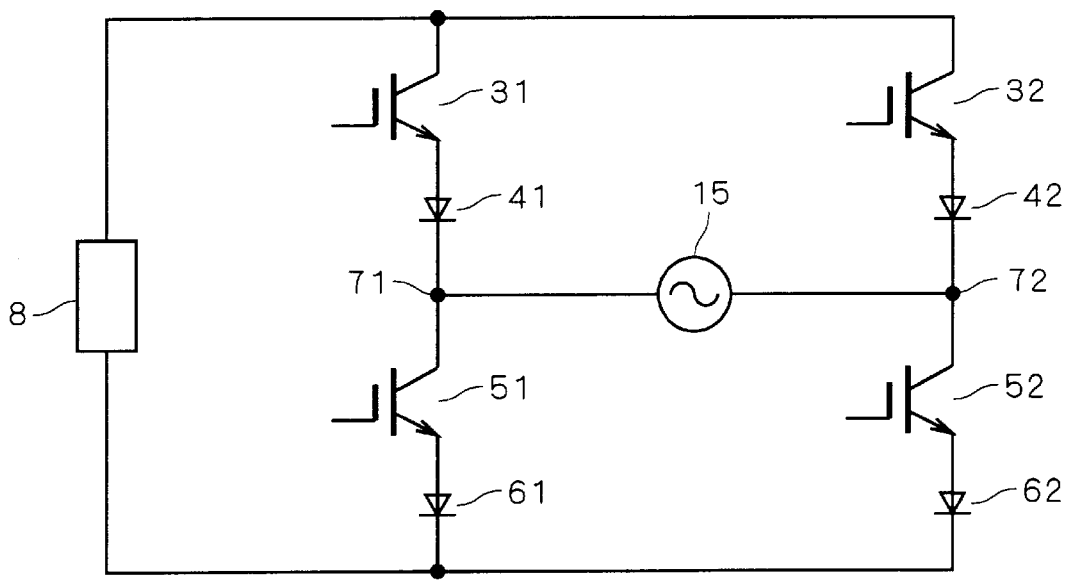
FIG. 8 is a circuit diagram showing a configuration of a bridge-type converter circuit as a third practical example of the semiconductor converter circuit in accordance with the preferred embodiment of the present invention.

FIG. 8 is a circuit diagram showing a configuration of a bridge-type converter circuit as the third practical example of the semiconductor converter circuit in accordance with the preferred embodiment of the present invention. The converter circuit shown in FIG. 8 comprises the IGBTs 31, 32, 51 and 52 and the diodes 41, 42, 61 and 62. The diodes 41, 42, 61 and 62 are reverse blocking diodes (rectifier diodes or Schottky diodes) made of silicon carbide, and connected in series to the IGBTs 31, 32 and 51 and 52, respectively. An AC power supply 15 is connected between the nodes 71 and 72.

Figure 9:
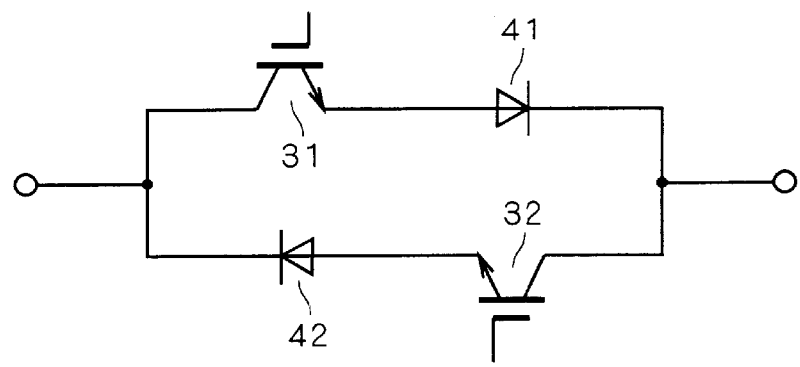
FIG. 9 is a circuit diagram showing a configuration of an AC switching circuit as a fourth practical example of the semiconductor converter circuit in accordance with the preferred embodiment of the present invention.

FIG. 9 is a circuit diagram showing a configuration of an AC switching circuit as the fourth practical example of the semiconductor converter circuit in accordance with the preferred embodiment of the present invention. The AC switching circuit shown in FIG. 9 comprises the IGBTs 31 and 32 and the diodes 41 and 42. The diodes 41 and 42 are reverse blocking diodes (rectifier diodes or Schottky diodes) made of silicon carbide, and connected in series to the IGBTs 31 and 32, respectively.

Figure 10:
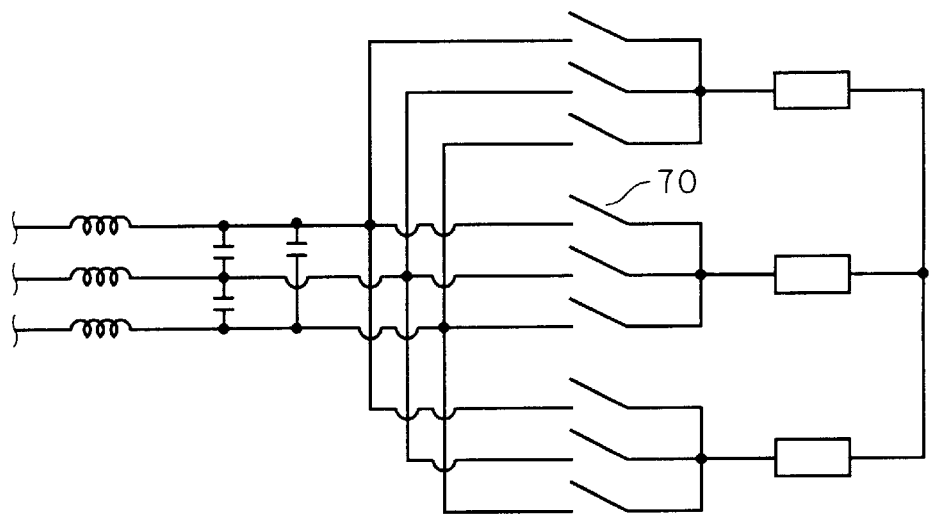
FIG. 10 is a circuit diagram showing a configuration of a matrix converter circuit as a fifth practical example of the semiconductor converter circuit in accordance with the preferred embodiment of the present invention.
Figure 11:
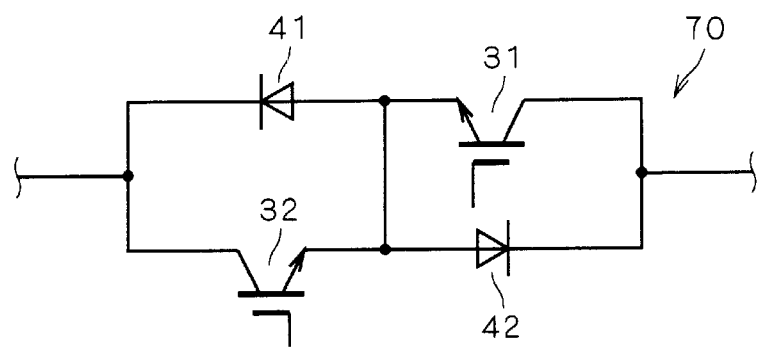
FIG. 11 is an enlarged circuit diagram showing a switch of the matrix converter circuit.

FIG. 10 is a circuit diagram showing a configuration of a matrix converter circuit as the fifth practical example of the semiconductor converter circuit in accordance with the preferred embodiment of the present invention. The matrix converter circuit shown in FIG. 10 comprises a plurality of switches 70. FIG. 11 is an enlarged circuit diagram showing one of the switches 70 of the matrix converter circuit. The switch 70 comprises the IGBTs 31 and 32 and the diodes 41 and 42. The diodes 41 and 42 are reverse blocking diodes (rectifier diodes or Schottky diodes) made of silicon carbide, and connected in series to the IGBTs 31 and 32, respectively.

Figure 12:
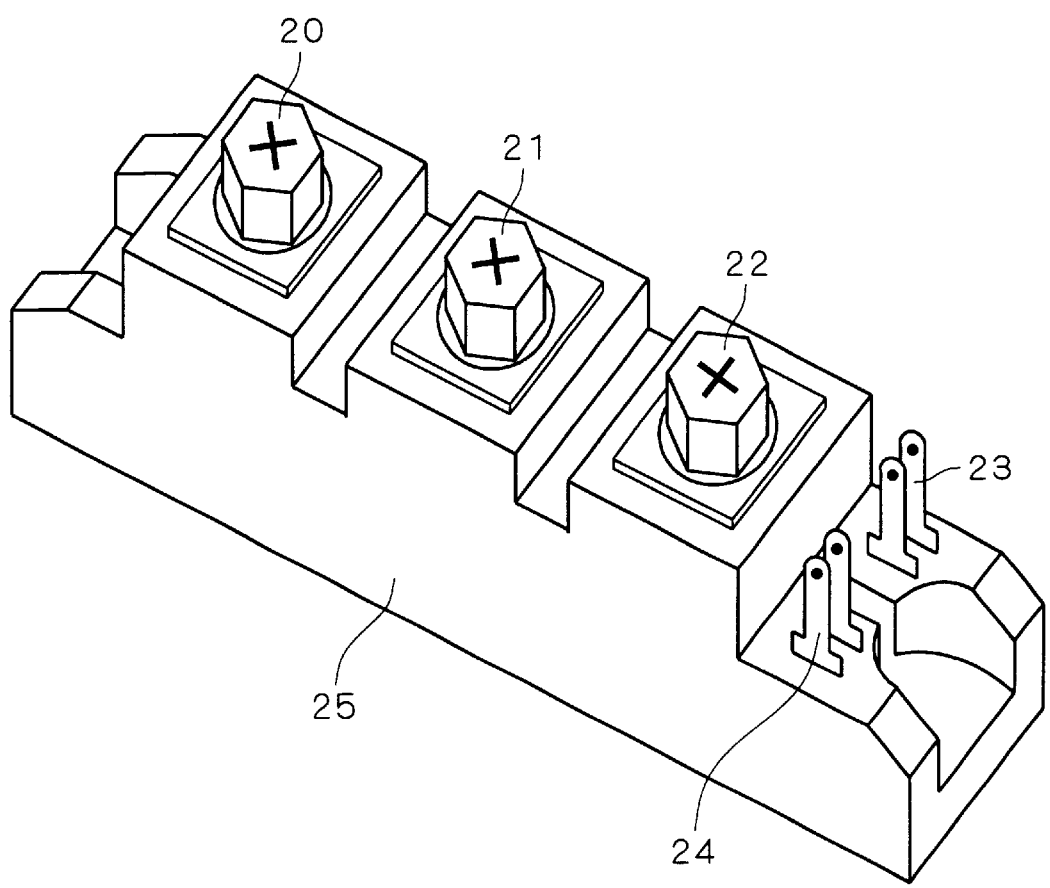
FIG. 12 is a perspective view showing an outward appearance of a circuit module in accordance with the preferred embodiment of the present invention.

FIG. 12 is a perspective view showing an outward appearance of a circuit module in accordance with the preferred embodiment of the present invention. The semiconductor converter circuit discussed above are formed on a predetermined circuit board (not shown), and this circuit board is provided in a sealed package 25 together with other circuit boards on which control circuits and peripheral circuits (e.g., snubber circuits) are formed and the like. On the sealed package 25, connection terminals 20 to 24 are provided for connecting the semiconductor converter circuit provided inside the package 25 and predetermined external devices (not shown). The connection terminals 20 to 24 are connected to the semiconductor converter circuit in the sealed package 25 with metal wires and the like. Thus, the semiconductor converter circuit is modularized into a circuit module, thereby ensuring downsizing of the device, reduction of wire inductance, simplification of the control circuits and peripheral circuits, and the like.

Thus, in the semiconductor converter circuit of the preferred embodiment of the present invention, a diode made of silicon carbide is used as a reverse blocking diode connected in series to a switching element. Therefore, as compared with the background-art semiconductor converter circuit using the diode made of silicon as the reverse blocking diode, the switching loss is remarkably reduced to improve efficiency and it is possible to prevent breakdown of the switching element by high reverse recovery voltage.

While the invention has been shown and described in detail, the foregoing description is in all aspects illustrative and not restrictive. It is therefore understood that numerous modifications and variations can be devised without departing from the scope of the invention.

What is claimed is:

1. A semiconductor power converter circuit comprising:

a switching element of reverse conductivity type; and a diode made of silicon carbide connected in series to said switching element at a polarity in which a forward current flows when said switching element comes into an ON state.

2. The semiconductor power converter circuit according to claim 1, wherein said diode is a Schottky diode.

3. The semiconductor power converter circuit according to claim 1, wherein said diode is connected to at least one of an anode side and a cathode side of said switching element.

4. The semiconductor power converter circuit according to claim 1, wherein said switching element is one of an IGBT (Insulated Gate Bipolar Transistor), a power MOSFET, a bipolar power transistor, a thyristor, a GTO (Gate Turn-Off) thyristor and a GCT (Gate Commutated Turn-Off) thyristor.

5. The semiconductor power converter circuit according to claim 1, being one of an inverter circuit, a converter circuit, a matrix converter circuit and an AC switching circuit.

6. A circuit module comprising:

a substrate on which a semiconductor power converter circuit having a switching element of reverse conductivity type and a diode made of silicon carbide connected in series to said switching element at a polarity in which a forward current flows when said switching element comes into an ON state;

a package in which said substrate is provided;

a connection terminal formed on said package and configured to connect said semiconductor power converter circuit and an external device.

7. The circuit module according to claim 6, wherein said diode is a Schottky diode.

8. The circuit module according to claim 6, wherein said diode is connected to at least one of an anode side and a cathode side of said switching element.

9. The circuit module according to claim 6, wherein said switching element is one of an IGBT (Insulated Gate Bipolar Transistor), a power MOSFET, a bipolar power transistor, a thyristor, a GTO (Gate Turn-Off) thyristor and a GCT (Gate Commutated Turn-Off) thyristor.

10. The circuit module according to claim 6, wherein said semiconductor power converter circuit is one of an inverter circuit, a converter circuit, a matrix converter circuit and an AC switching circuit.

* * * * *